(12) United States Patent
Ahn et al.

(10) Patent No.: US 8,207,529 B2
(45) Date of Patent: Jun. 26, 2012

(54) THIN FILM TRANSISTOR AND FLAT PANEL DISPLAY HAVING THE THIN FILM TRANSISTOR

(75) Inventors: Taek Ahn, Suwon-si (KR); Min-Chul Suh, Suwon-si (KR); Jin-Seong Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 82 days.

(21) Appl. No.: 12/856,854

(22) Filed: Aug. 16, 2010

(65) Prior Publication Data
US 2010/0308317 A1    Dec. 9, 2010

Related U.S. Application Data

(62) Division of application No. 11/582,973, filed on Oct. 19, 2006, now Pat. No. 7,799,597.

(30) Foreign Application Priority Data

Oct. 21, 2005 (KR) .................................. 2005-99614

(51) Int. Cl.
*H01L 51/00* (2006.01)
(52) U.S. Cl. .................................. 257/40; 257/E51.006
(58) Field of Classification Search .................. 257/40, 257/E51.005, E51.006; 438/99, 142, 780
See application file for complete search history.

(56) References Cited

U.S. PATENT DOCUMENTS
2007/0040169 A1* 2/2007 Kim et al. ........................ 257/40

FOREIGN PATENT DOCUMENTS
KR    10-2004-0012212 A    2/2004

OTHER PUBLICATIONS
U.S. Appl. No. 11/582,973, filed Oct. 19, 2006, Taek Ahn et al., Samsung Mobile Display Co., Ltd.

* cited by examiner

*Primary Examiner* — A. Sefer
*Assistant Examiner* — Nikolay Yushin
(74) *Attorney, Agent, or Firm* — H.C. Park & Associates, PLC (57) ABSTRACT

A thin film transistor includes: a gate electrode; source and drain electrodes insulated from the gate electrode; an organic semiconductor layer that is insulated from the gate electrode and electrically connected to the source and drain electrodes; an insulating layer that insulates the gate electrode from the source and drain electrodes or the organic semiconductor layer; a hydrophobic layer which covers the source and drain electrodes or insulating layer and has an opening that defines a region corresponding to the organic semiconductor layer; and a hydrophilic layer formed in the opening of the hydrophobic layer, wherein the organic semiconductor layer is formed on the hydrophilic layer. The thin film transistor includes the organic semiconductor layer having a highly precise pattern that is formed without an additional patterning process.

18 Claims, 6 Drawing Sheets

FIG. 6

# THIN FILM TRANSISTOR AND FLAT PANEL DISPLAY HAVING THE THIN FILM TRANSISTOR

CROSS-REFERENCE TO RELATED APPLICATIONS

This application is a divisional of U.S. patent application Ser. No. 11/582,973 filed Oct. 19, 2006, now U.S. Pat. No. 7,799,597 which claims the benefit of Korean Patent Application No. 10-2005-0099614, filed on Oct. 21, 2005, in the Korean Intellectual Property Office, the disclosure of which is incorporated herein in its entirety by reference.

BACKGROUND OF THE INVENTION

1. Field of the Invention

Aspects of the present invention relate to a thin film transistor (TFT), a method of manufacturing the same, and a flat panel display having the TFT, and more particularly, to a TFT including an organic semiconductor layer that is spontaneously formed on a hydrophilic layer and that is not formed in a hydrophobic region surrounding the hydrophilic layer. Aspects of the present invention further include a method of manufacturing the TFT and a flat panel display having the TFT. Since the TFT includes the organic semiconductor layer having a highly precise pattern that is formed without an additional patterning process of the organic semiconductor layer, the manufacturing cost and time are low. In addition, the TFT has improved electric properties.

2. Description of the Related Art

Thin film transistors (TFTs), which are used in flat panel displays, such as liquid crystalline display devices (LCD), organic light-emitting display devices, inorganic light-emitting display devices, and the like, are used as switching devices for controlling pixel operations and as driving devices for operating pixels.

TFTs include a semiconductor layer including source/drain regions and a channel region interposed between the source region and drain region, a gate electrode insulated from the semiconductor layer and located in a region corresponding to the channel region, and source and drain electrodes respectively contacting the source and drain regions.

Organic TFTs include an organic semiconductor layer composed of an organic semiconductor material. Organic TFTs can be manufactured at low temperatures, and thus, a plastic substrate can be used. Due to these advantages of organic TFTs, recent research into organic TFTs has been performed. For example, Korean Patent Publication No. 2004-0012212 discloses an organic TFT.

When an organic TFT is manufactured, patterning of the organic semiconductor layer is necessary. However, when the organic semiconductor layer is patterned, material of the organic semiconductor layer can be degraded, and film layers located under the organic semiconductor layer can be damaged, and thus, the electric properties of the organic TFT can deteriorate. Further, additional patterning of the organic semiconductor layer can increase the manufacturing cost and time consumption. Therefore, an improvement regarding these issues is required.

SUMMARY OF THE INVENTION

Aspects of the present invention provide a thin film transistor (TFT) including an organic semiconductor layer that is formed on a hydrophilic layer, a method of manufacturing the same and a flat panel display having the TFT.

According to an aspect of the present invention, there is provided a TFT including: a gate electrode; source and drain electrodes insulated from the gate electrode; an organic semiconductor layer insulated from the gate electrode; an organic semiconductor layer that is insulated from the gate electrode and electrically connected to the source and drain electrodes; an insulating layer that insulates the gate electrode from the source and drain electrodes or the organic semiconductor layer; a hydrophobic layer having an opening that defines a region corresponding to the organic semiconductor layer; and a hydrophilic layer formed in the opening of the hydrophobic layer, wherein the organic semiconductor layer is formed on the hydrophilic layer.

According to another aspect of the present invention, there is provided a method of manufacturing a thin film transistor, the method including: forming a gate electrode on a substrate; forming an insulating layer to cover the gate electrode; forming source and drain electrodes on the insulating layer; forming a hydrophobic layer to cover the source and drain electrodes; forming an opening in the hydrophobic layer to correspond to an organic semiconductor layer to be formed; forming a hydrophilic layer on the opening of the hydrophobic layer; and forming the organic semiconductor layer on the hydrophilic layer using an organic semiconductor layer forming material.

According to another aspect of the present invention, there is provided a method of manufacturing a thin film transistor, the method including: forming a gate electrode on a substrate; forming an insulating layer to cover the gate electrode; forming a hydrophobic layer to cover the insulating layer; forming an opening in the hydrophobic layer to correspond to an organic semiconductor layer to be formed; forming a hydrophobic layer in the opening of the hydrophilic layer; forming the organic semiconductor layer on the hydrophilic layer using an organic semiconductor layer forming material; and forming source and drain electrodes.

According to another aspect of the present invention, there is provided a method of manufacturing a thin film transistor, the method including: forming source and drain electrodes on a substrate; forming a hydrophobic layer to cover the source and drain electrodes; forming an opening in the hydrophobic layer to correspond to an organic semiconductor layer to be formed; forming an hydrophilic layer in the opening of the hydrophobic layer; forming the organic semiconductor layer on the hydrophilic layer using an organic semiconductor layer forming material; forming an insulating layer to cover the organic semiconductor layer and the source and drain electrodes; and forming a gate electrode on the insulating layer.

According to another aspect of the present invention, there is provided a pixel of a flat panel display device that includes at least one thin film transistor and at least one light-emitting device electrically connected to the source or drain electrode of the thin film transistor.

According to another aspect of the present invention, there is provided a flat panel display device comprising a plurality of the pixels.

According to another aspect of the present invention, there is provided a method of forming a patterned layer of an organic semiconductor material on an underlying layer without etching the organic semiconductor material, the method comprising: forming a hydrophobic layer on the underlying layer; forming an opening in the hydrophobic layer to define a patterned region; forming a hydrophilic layer in the patterned region defined by the opening in the hydrophobic layer; and contacting the hydrophilic layer with a organic semiconductor material, wherein the organic semiconductor material has a property of being attracted to the hydrophilic layer and repelled by the hydrophobic layer such that the patterned layer of organic semiconductor material is formed only on the hydrophilic layer.

The TFT includes the organic semiconductor layer that is spontaneously formed on a hydrophilic layer and that is not formed on a hydrophobic layer. As a result, the organic semiconductor layer can be formed in a defined region by creating a hydrophilic layer in an opening of a hydrophobic layer, and additional patterning of the organic semiconductor layer is not necessary. Therefore, a manufacturing cost and manufacturing time of the TFT can be decreased. In addition, the TFT has improved electric properties.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
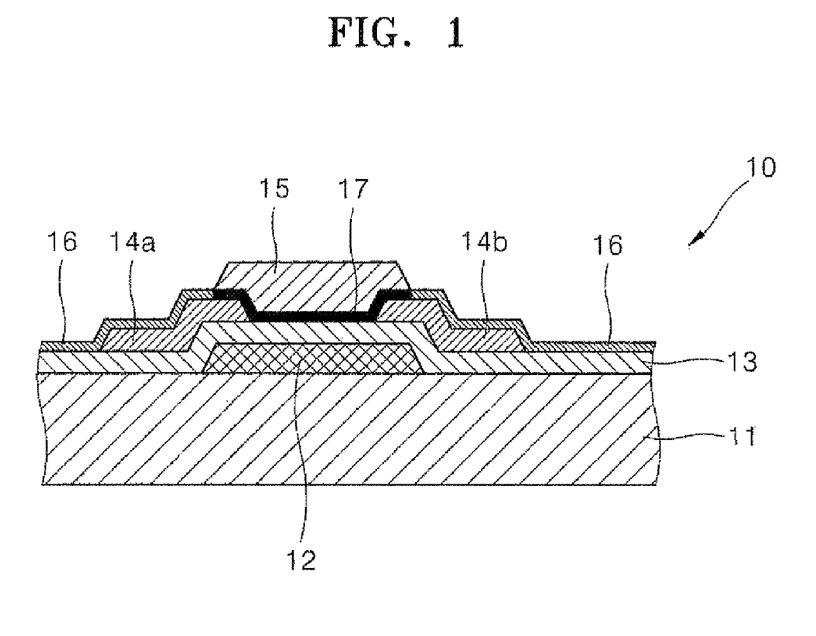
FIGS. 1 through 3 are sectional views illustrating structures of thin film transistors (TFTs) according to embodiments of the present invention

FIG. 1 is a sectional view of a thin film transistor (TFT) 10 according to an embodiment of the present invention. The TFT 10 includes a substrate 11, a gate electrode 12, an insulating layer 13, source and drain electrodes 14a and 14b, a hydrophobic layer 16, a hydrophilic layer 17 and an organic semiconductor layer 15, which are sequentially stacked upon one another.

The substrate 11 may be a glass, plastic, or metal substrate, for example. The glass substrate may be formed of silicon oxide, silicon nitride, and the like. The plastic substrate may be formed of an insulating organic compound. For example, the insulating organic compound may be selected from the group consisting of polyethersulfone (PES), polyacrylate (PAR), polyetherimide (PEI), polyethylene naphthalate (PEN), polyethyleneterephthalate (PET), polyphenylene sulfide (PPS), polyallylate, polyimide, polycarbonate (PC), cellulous triacetate (CAT), and cellulose acetate propionate (CAP), but is not limited thereto. The metal substrate may include at least one selected from the group consisting of carbon, iron, chrome, manganese, nickel, titanium, molybdenum, stainless steel (SUS), an Invar alloy, an Inconel alloy, and a Kovar alloy, but is not limited thereto. The metal substrate may be a metal foil. If a flexible substrate is desired, plastic or metal can be used.

A buffer layer, a barrier layer, or an impurities diffusion inhibition layer may be formed on one surface or both surfaces of the substrate 11. In particular, when the substrate 11 is a metal substrate, an insulating layer (not shown) may be further formed on the substrate 11.

The gate electrode 12 having a predetermined pattern is formed on the substrate 11. For example, the gate electrode 12 may be formed of a metal or a metal alloy, such as Au, Ag, Cu, Ni, Pt, Pd, Al, Mo, an Al:Nd alloy, an Mo:W alloy, etc. but the material of the gate electrode 12 is not limited thereto.

The insulating layer 13 is formed on the gate electrode 12 to cover the gate electrode 12. The insulating layer 13 may be formed of an inorganic compound, such as a metal oxide or a metal nitride, or an organic compound, such as an insulting organic polymer, but the material of the insulating layer 13 is not limited to thereto.

The source and drain electrodes 14a and 14b are formed on the insulating layer 13. As shown in FIG. 1, the source and drain electrodes 14a and 14b may overlap with a part of the gate electrode 12, but the structure of the source and drain electrodes 14a and 14b is not limited to thereto. Non-limiting examples of the material for the source and drain electrodes 14a and 14b include metals, such as Au, Pd, Pt, Ni, Rh, Ru, Ir, Os, Al and Mo, metal alloys of at least two metals, an Al:Nd alloy, an MoW alloy, metallic oxides, such as indium tin oxide (ITO), indium zinc oxide (IZO), NiO, $Ag_2O$, $In_2O_3$—$Ag_2O$, $CuAlO_2$, $SrCu_2O_2$, and Zr-doped ZnO. Combinations of two or more of the above-mentioned metals or metallic oxides can be used.

The hydrophobic layer 16 and the hydrophilic layer 17 are formed on the source and drain electrodes 14a and 14b to cover the source and drain electrodes 14a and 14b or the insulating layer 13. The hydrophobic layer 16 includes an opening defining a region corresponding to the organic semiconductor layer 15 described later. The hydrophilic layer 17 is formed in the opening. As used herein, the term "opening" may refer to a region surrounded by a hydrophobic layer and where the hydrophobic layer is not formed. The term "opening" may also refer to a region where the hydrophobic layer is removed after being formed or a region where the hydrophobic layer is altered to be a hydrophilic region. The organic semiconductor layer 15 is formed after the hydrophobic layer 16 and the hydrophilic layer 17 are formed, and since a material of the organic semiconductor layer 15 is generally hydrophilic, the organic semiconductor layer can be formed only on the hydrophilic layer 17, even when both the hydrophobic layer 16 and the hydrophobic layer 17 come into contact with the material that forms the organic semiconductor layer 15. Therefore, the organic semiconductor layer 15 can be formed without additional patterning.

Throughout this specification, the term of "hydrophilic layer" is used to indicate layer which is less hydrophobic than the "hydrophobic layer."

The hydrophobic layer 16 may include a group that allows a contact angle of water on the hydrophobic layer at least 90°, preferably, greater than 90°, more preferably, in a range of greater than 90° and less than 180°. The hydrophilic layer 17 may include a group that allows a contact angle of water on the hydrophilic layer 10°-90°.

The term "contact angle" refers to the shape of a liquid droplet resting on a solid surface. With the assumption that there is a liquid on a solid plane in air, the term "contact angle" indicates the angle between the tangent line of the liquid and the tangent line of the solid plane at a contact point of the liquid, the solid plane, and the air. Here, it can be regarded that the solid plane adsorbs liquid vapor.

A contact angle may be used as a measure of wetting of a solid plane by liquid. For example, a small contact angle indicates a high degree of wetting, i.e., a hydrophilic property and a high surface energy, and a large contact angle indicates a low degree of wetting, i.e., a hydrophobic property and a low surface energy.

For measuring the contact angle, the following various methods may be used. These methods include a method of measuring a contact angle by directly projecting the shape of a liquid drop onto a screen, a method of measuring the volume and height of a liquid droplet and the radius of a lower circle to calculate a contact angle with the assumption that the liquid droplet is considered as a partial sphere, methods of measuring a tilt angle and an adhesive tension of a solid plane in the state where a curved portion of a liquid droplet contacting the solid plane is positioned to form a horizontal plane and the solid plane is positioned above and perpendicular to the liquid droplet, etc. The above-described explanations of the contact angle and contact angle measurement methods are apparent to those of ordinary skilled in the art.

The contact angles of the hydrophobic layer 16 and the hydrophilic layer 17 may be measured, for example, using a contact angle method using water. The contact angle method using water may be a method of measuring the angle between the surface of layer and a water droplet using a CCD while supplying water in microliter amounts at a room temperature.

The material of the hydrophobic layer 16 may include a $C_3$-$C_{30}$ alkyl group; a $C_3$-$C_{30}$ alkyl group substituted with one or more halogen atoms, and the like, but the material is not limited thereto.

More particularly, the hydrophobic layer 16 may include a unit having formula (1) below or a repeating unit of formula (2) below:

formula (1)

formula (2)

In formulas (1) and (2), R1, R2 and R3 are each selected from a halogen atom; a C3-C30 alkyl group; and a C3-C30 alkyl group substituted by at least one halogen atom, wherein at least one of R1, R2 and R3 may be a C3-C30 alkyl group; or a C3-C30 alkyl group substituted by at least one halogen atom. For example, R1, R2 and R3 may be each selected from a halogen atom; a C3-C20 alkyl group; and a C3-C20 alkyl group substituted by at least one halogen atom, wherein at least one of R1, R2 and R3 may be a C3-C20 alkyl group or a C3-C20 alkyl group substituted by at least one halogen atom.

In formulas (1) and (2), R4 may be a C3-C30 alkyl group; or a C3-C30 alkyl group substituted by at least one halogen atom. For example, R4 may be a C3-C20 alkyl group; or a C3-C20 alkyl group substituted by at least one halogen atom.

In formulas (1) and (2), * indicates binding with the source and drain electrodes 14a and 14b or the insulating layer 13.

In particular, the repeating unit having formula (2) may be obtained as a result of hydrolysis when a material having an alkoxy group is used as a starting material for the hydrophobic layer 16.

In a TFT according to an embodiment of the present invention, the hydrophobic layer 16 may include a unit having formula (3) or (4), but the unit is not limited thereto;

formula (3)

formula (4)

In formulas (3) and (4), * indicates binding with the source and drain electrodes 14a and 14b or the insulating layer 13.

Examples of a material of the hydrophilic layer 17 may include a C5-C30 aryl group, a C3-C30 heteroaryl group, a C6-C30 aralkyl group, a C4-C30 heteroaralkyl group and the like, but are not limited thereto.

More particularly, the hydrophilic layer 17 may include a unit having formula (5) below or a repeating unit having formula (6) below:

formula (5)

formula (6)

In formulas (5) and (6), Q1, Q2 and Q3 are each selected from the group consisting of a halogen atom, a C5-C30 aryl group, a C3-C30 heteroaryl group, a C6-C30 aralkyl group and a C4-C30 heteroaralkyl group, wherein at least one of Q1, Q2 and Q3 may be a C5-C30 aryl group, a C3-C30 heteroaryl group, a C6-C30 aralkyl group, or a C4-C30 heteroaralkyl group.

In formulas (5) and (6), Q4 may be a C5-C30 aryl group, a C3-C30 heteroaryl group, a C6-C30 aralkyl group or a C4-C30 heteroaralkyl group.

In formulas (5) and (6), *' indicates binding with the source and drain electrodes 14a and 14b or the insulating layer 13.

In the TFT according to an embodiment of the present invention, the hydrophilic layer 17 may include a unit having formula (7) or (8) below, but the unit is not limited thereto;

formula (7)

formula (8)

In formulas (7) and (8), *' indicates binding with the source and drain electrodes 14a and 14b or the insulating layer 13.

Throughout this specification, where an aryl group, a heteroaryl group, an aralkyl group or a heteroaralkyl group are mentioned, it is to be understood that such groups may include at least two carbocyclic rings or heterocyclic rings, which may be attached together or may be fused.

Throughout this specification, a term "aralkyl group" refers to an aryl-substituted alkyl radical.

Throughout the specification, where a heteroaryl group or a heteroararyl group are mentioned, it is to be understood that such groups may include at least one hetero atom selected from the group consisting of N, O, P and S.

The aryl group, heteroaryl group, aralkyl group or heteroaralkyl group may be each substituted by at least one selected from the group consisting of a halogen atom, a cyano group and a hydroxyl group.

The organic semiconductor layer 15 is formed on the hydrophilic layer 17. When the organic semiconductor layer 15 is formed, the organic semiconductor layer 15 is spontaneously formed only on the hydrophilic layer 17 even when both the hydrophobic layer 16 and the hydrophilic layer 17 come into contact with the material of the organic semiconductor layer 15. This is because the material of the organic semiconductor layer 15 is generally hydrophilic and is therefore attracted to the hydrophilic layer and repelled by the hydrophobic layer. Therefore, an additional patterning process to form the organic semiconductor layer 15 of the TFT according to an aspect of the present invention is unnecessary.

Examples of an organic semiconductor material for the organic semiconductor layer 15 include pentacene, tetracene, anthracene, naphthalene, α-6-thiophen, α-4-thiophen, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylene vinylene and a derivative thereof, polyparaphenylene and a derivative thereof, polyfluorene and a derivative thereof, polythiophene vinylene and a derivative thereof, a polythiophene-heterocyclic aromatic copolymer and a derivative thereof, an oligonaphthalene and a derivative thereof, an oligothiophene of α-5-thiophene and a derivative thereof, a metal-containing or metal-free phthalocyanine and a derivative thereof, pyromellitic dianhydride and a derivative thereof, pyromellitic diimide and a derivative thereof, or the like. Combinations of two or more of these materials can be used.

Figure 2:
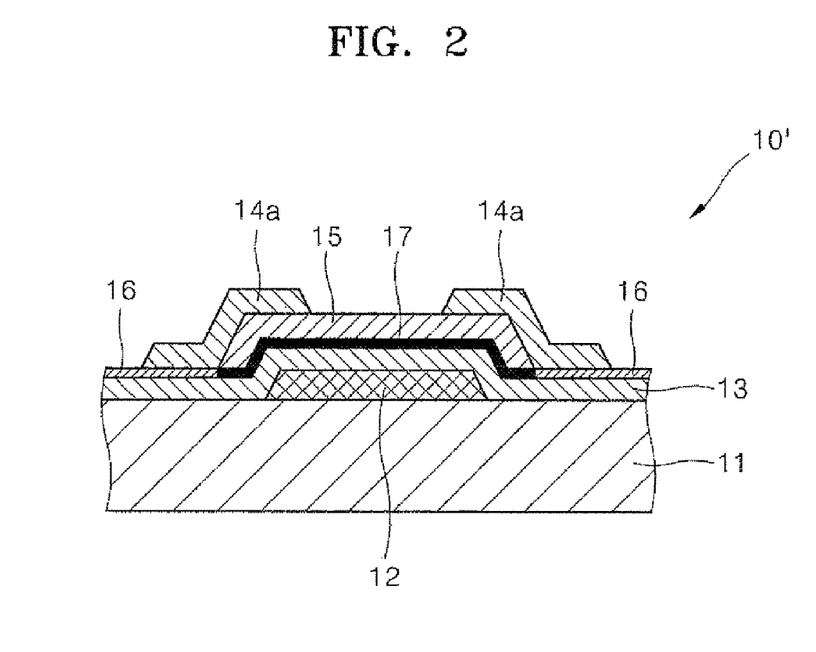

FIG. 2 is a sectional view of TFT 10' according to another embodiment of the present invention. The TFT 10' includes a substrate 11, a gate electrode 12, insulating layer 13, a hydrophobic layer 16, a hydrophilic layer 17, an organic semiconductor layer 15 and source and drain electrodes 14a and 14b, which are sequentially stacked upon one another.

Figure 3:
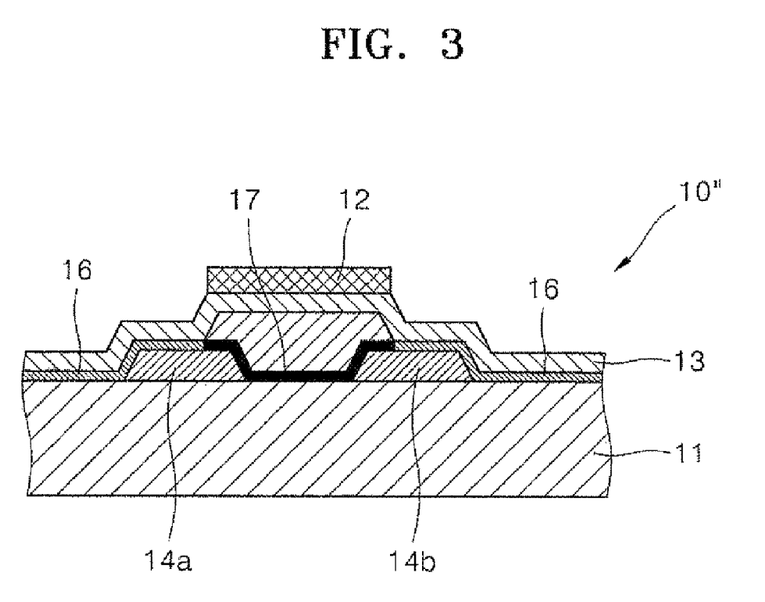

FIG. 3 is a sectional view of TFT 10" according to another embodiment of the present invention. The TFT 10" includes a substrate 11, source and drain electrodes 14a and 14b, a hydrophobic layer 16, a hydrophilic layer 17, an organic semiconductor layer 15, an insulating layer 13 and gate electrode 12, which are sequentially stacked upon one another. The materials that make up the substrate 11, gate electrode 12, insulating layer 13, hydrophobic layer 16, hydrophilic layer 17, organic semiconductor layer 15 and source and drain electrodes 14a and 14b in TFTs 10' and 10" shown in FIGS. 2 and 3 have the same composition as the equivalent structures in the TFT 10 of FIG. 1, and thus a detailed description of the TFTs 10' and 10" will be omitted.

A TFT according to aspects of the present invention may be formed using various methods. For example, a method of manufacturing a TFT according to the embodiment of the FIG. 1 may include: forming a gate electrode on a substrate; forming an insulating layer to cover the gate electrode; forming source and drain electrodes on the insulating layer; forming a hydrophobic layer to cover the source and drain electrodes; forming an opening in the hydrophobic layer to define a region in which an organic semiconductor layer is to be formed; forming a hydrophilic layer in the opening of the hydrophobic layer; and forming the organic semiconductor layer on the hydrophilic layer by providing an organic semiconductor layer forming material.

A method of manufacturing a TFT according to the embodiment of FIG. 2 may include: forming a gate electrode on a substrate; forming an insulating layer to cover the gate electrode; forming a hydrophobic layer to cover the insulating layer; forming an opening in the hydrophobic layer to define a region in which an organic semiconductor layer is to be formed; forming a hydrophilic layer in the opening of the hydrophobic layer; forming an organic semiconductor layer on the hydrophilic layer by providing an organic semiconductor layer forming material; and forming source and drain electrodes.

A method of manufacturing a TFT according to the embodiment of FIG. 3 may include: forming source and drain electrodes on a substrate; forming a hydrophobic layer to cover the source and drain electrodes; forming an opening in the hydrophobic layer to define a region in which an organic semiconductor layer is to be formed; forming an hydrophilic layer in the opening of the hydrophobic layer; forming the organic semiconductor layer on the hydrophilic layer by providing an organic semiconductor layer forming material; forming an insulating layer to cover the organic semiconductor layer and the source and drain electrodes; and forming a gate electrode on the insulating layer.

The method of manufacturing a TFT may be more generally described as including: forming a gate electrode; forming an insulating layer; forming source and drain electrodes; forming a hydrophobic layer; forming an opening in the hydrophobic layer to define a region corresponding to an organic semiconductor layer to be formed; forming a hydrophilic layer in the region of the hydrophobic layer defined by the opening; and forming the organic semiconductor layer on the hydrophilic layer. In this description, only the relative order in which the hydrophobic layer, hydrophilic layer and organic semiconductor layer are formed is specified. That is, the hydrophobic layer must be formed before an opening can be provided in the hydrophobic layer and before the hydrophilic layer can be formed in the opening. The hydrophilic layer must be formed before the organic semiconductor layer is formed on the hydrophilic layer. It is to be understood that the remaining layers may be formed in any order on a substrate that provides a thin film transistor. For example, the layers may be formed in any order that provides a TFT of the embodiments shown in FIG. 1, FIG. 2 or FIG. 3.

When the source and drain electrodes include an oxidizable metal, the forming the source and drain electrodes may further include oxidizing surfaces of the source and drain electrodes. This operation is performed in order to increase the adhesive force between the source/drain electrodes and hydrophobic layer and/or hydrophilic layer which will be formed later.

The oxidizing the surfaces of the source and drain electrodes can be implemented using various methods. For example, a method of annealing the surfaces of the source and drain electrodes in an atmospheric condition such as, for example, in an oxygen atmosphere, a method of treating the surfaces of the source and drain electrodes with a gas such as, for example, oxygen plasma, a method of chemically treating the surfaces of the source and drain electrodes with an oxidant, for example, hydrogen peroxide, or other methods can be used. However, the methods that can be used to oxidize the surfaces of the source and drain electrodes are not limited thereto.

The forming of the hydrophobic layer or the hydrophilic layer may be performed using a deposition method; a coating method, such as, for example, spin coating, deep coating, micro contact printing, inkjet printing, etc.; or a self-assembled monolayer manufacturing method, but is not limited to these. These methods are known to those of ordinary skill in the art. In the self-assembled monolayer manufacturing method, a catalyst may be further used to facilitate a reaction, such as hydrolysis, condensation, etc., involved in forming the hydrophobic layer or the hydrophilic layer.

The hydrophobic layer may include a group leading to a contact angle of water on the hydrophobic layer of at least 90°, such as, for example, greater than 90°, or more specifically, in a range of greater than 90° and less than 180°. Examples of the hydrophobic layer include a C3-C30 alkyl group; and a halogen atom-substituted C3-C30 alkyl group, but are not limited thereto.

The hydrophilic layer may include a group which allows a contact angle of water on the hydrophilic layer 10°-90°. Examples of groups that may be included in the hydrophilic layer include a C5-C30 aryl group, a C3-C30 heteroaryl group, a C6-C30 aralkyl group, and a C4-C30 heteroaralkyl group, but are not limited thereto.

More particularly, the hydrophobic layer may be formed by using a compound having formula (9) below as a reactant in forming the hydrophobic layer:

formula (9)

In formula (9), $R_5$, $R_6$ and $R_7$ are each selected from a halogen atom; a $C_1$-$C_{10}$ alkoxy group; a $C_3$-$C_{30}$ alkyl group; or a $C_3$-$C_{30}$ alkyl group substituted by a halogen atom wherein at least one of $R_5$, $R_6$ and $R_7$ may be a $C_3$-$C_{30}$ alkyl group; or a $C_3$-$C_{30}$ alkyl group substituted by a halogen atom. $R_8$ is halogen atom or a $C_1$-$C_{10}$ alkoxy group.

For example, depending on the selection of $R_5$, $R_6$ and $R_7$, the compound of formula (9) may react directly with the source and drain electrodes 14a and 14b and/or the insulating layer 13 to form the unit of formula (1) or may react with itself as well as with the source and drain electrodes 14a and 14b or the insulating layer 13 to form the repeating unit of formula (2).

In a method of manufacturing a TFT according to an embodiment of the present invention, the hydrophobic layer 16 may be formed using a compound having formula (10) or (11) below. However, the method is not limited to these compounds.

formula (10)

formula (11)

For example, a compound having formula (10) or (11) may react with the source and drain electrodes 14a and 14b and/or the insulating layer 13 to form a unit of formula (3) or (4), respectively.

The hydrophilic layer may be formed using a compound having formula (12) below as a reactant in forming the hydrophilic layer:

formula (12)

In formula (12), Q5, Q6 and Q7 are each selected from a halogen atom, a C1-C10 alkoxy group, a C5-C30aryl group, a C3-C30 heteroaryl group, a C6-C30 aralkyl group or a C4-C30 heteroaralkyl group, wherein at least one of Q5, Q6 and Q7 is a C5-C30 aryl group, a C3-C30 heteroaryl group, a C6-C30 aralkyl group or a C4-C30 heteroaralkyl group, and Q8 is a halogen atom or a C1-C10 alkoxy group.

For example, depending on the selection of $Q_5$, $Q_6$ and $Q_7$, the compound of formula (12) may react directly with the source and drain electrodes 14a and 14b and/or the insulating layer 13 in the region from which the hydrophobic layer has been removed to form the unit of formula (5) or may react with itself as well as with the source and drain electrodes 14a and 14b or the insulating layer 13 in the region from which the hydrophobic layer has been removed to form the repeating unit of formula (6)

In a method of manufacturing a TFT according to an embodiment of the present invention, the hydrophilic layer may be formed using a compound having formula (13) or (14) below:

formula (13)

formula (14)

For example, a compound having formula (13) or (14) may react with the source and drain electrodes 14a and 14b and/or the insulating layer 13 in the region from which the hydrophobic layer has been removed to form a unit of formula (7) or (8), respectively.

In the methods of manufacturing TFTs according to aspects of the present invention, the forming of an opening that defines a region corresponding to the organic semiconductor layer 15 in the hydrophilic layer 17 may be performed using various known methods. For example, laser ablation technology (LAT) may be used to remove the hydrophobic layer in the region where the organic semiconductor layer is to be formed. An opening having at least about 5 μm in width can be formed using laser ablation, which is suitable to form a precise opening. Accordingly, an organic semiconductor layer having a very precise pattern can be obtained using laser ablation.

Hereinafter, a method of manufacturing a TFT according to an embodiment of the present invention will be described with reference to FIGS. 4A through 4G.

Figure 4A:
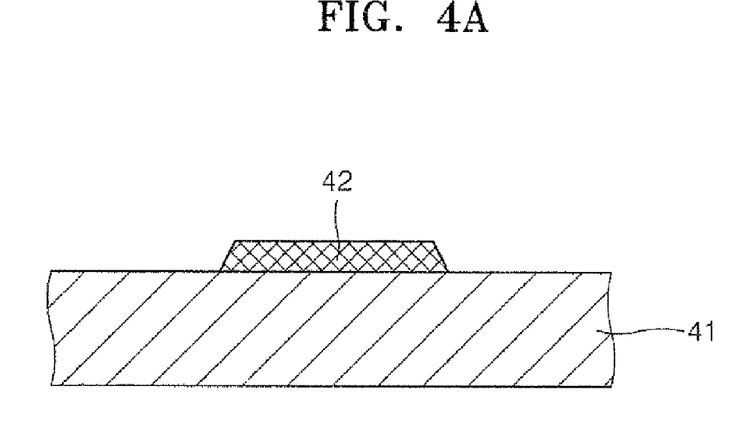
FIGS. 4A through 4G are sectional views illustrating sequentially a method of manufacturing a TFT according to an embodiment of the present invention.
Figure 4B:
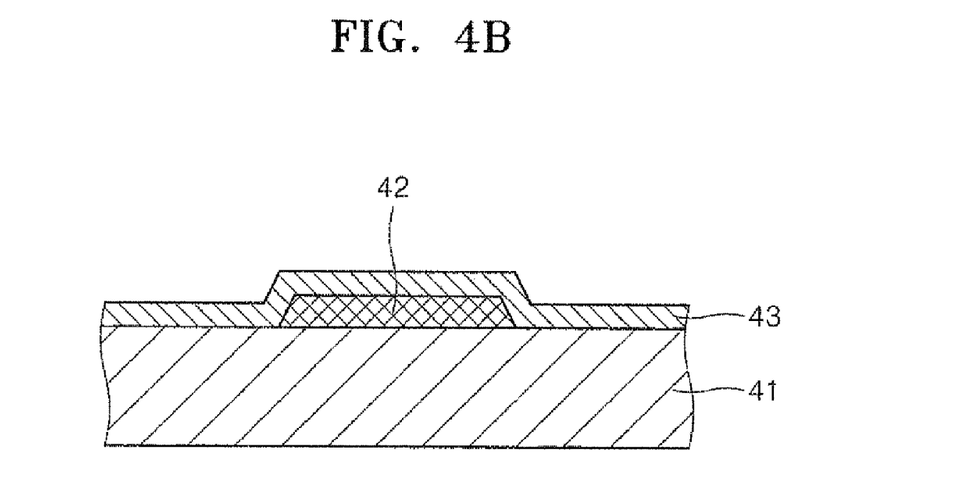
Figure 4C:
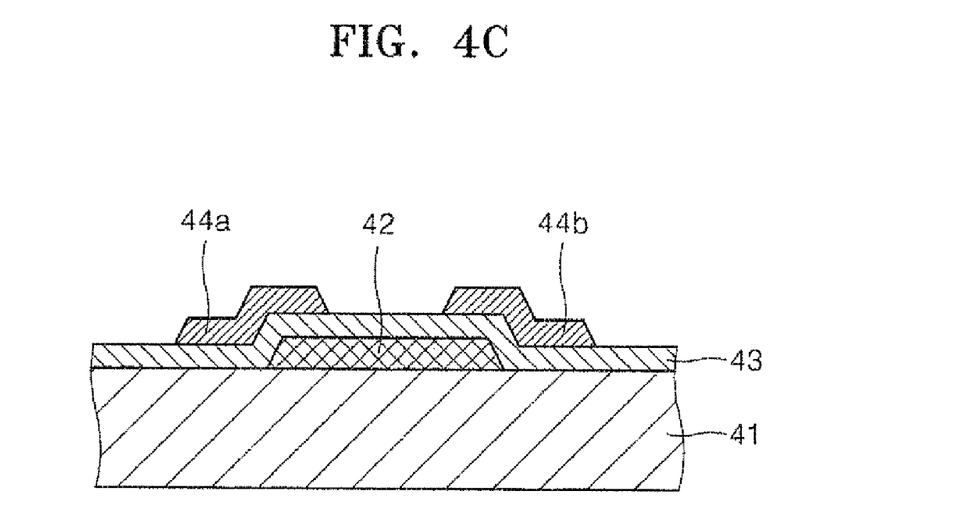
Figure 4D:
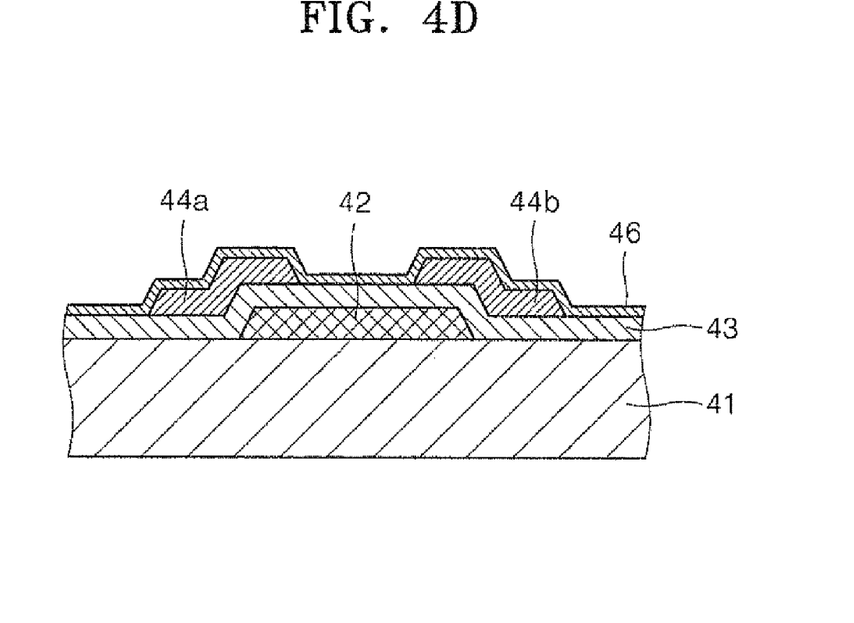

A gate electrode 42 is formed on a substrate 41 as shown in FIG. 4A, and an insulating layer 43 is formed to cover the gate electrode 42 as shown in FIG. 4B. Next, source and drain electrodes 44a and 44b having a predetermined pattern are formed on the insulating layer 43. Next, a hydrophobic layer 46 is formed to cover the source and drain electrodes 44a and 44b and the insulating layer 43.

The hydrophobic layer 46 may be formed using a deposition method; a coating method, such as, for example, spin coating, dip coating, micro contact printing, inkjet printing, etc.; or a self-assembled monolayer manufacturing method, all of which are known to those of skill in the art. For example, a compound that attaches to the source and drain electrodes 44a and 44b and the insulating layer 43 may be applied.

Figure 4E:
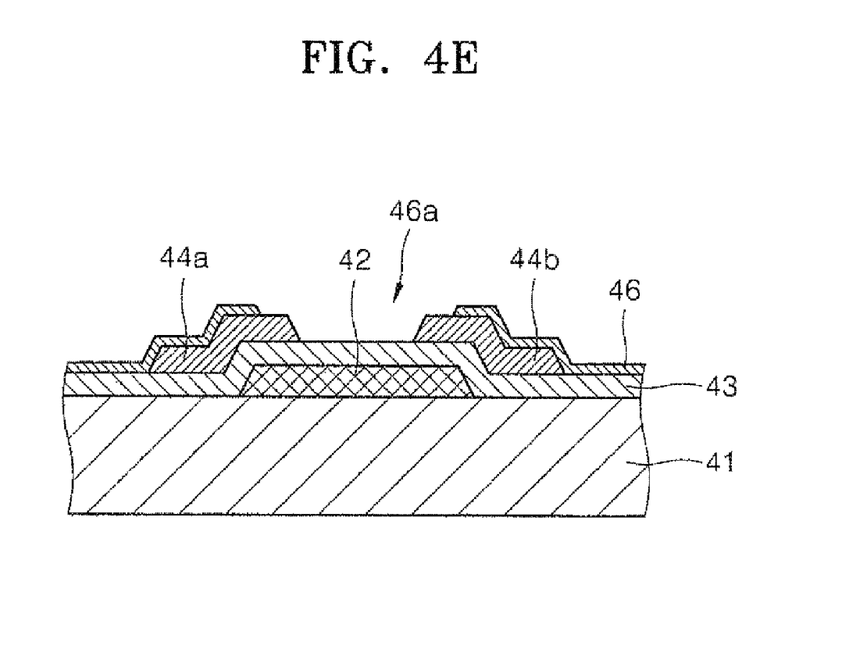
Figure 4F:
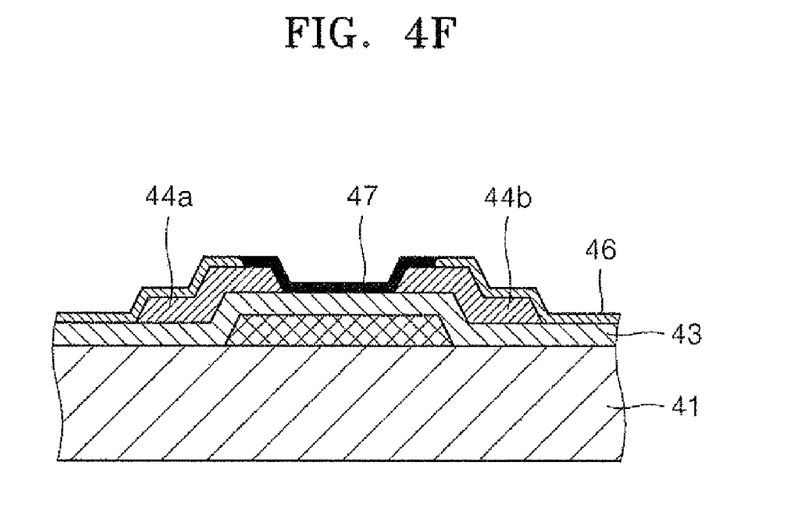

Next, an opening 46a is formed in the hydrophobic layer 46 as shown in FIG. 4E by etching to define a region in which an organic semiconductor layer is to be formed. Here, various known etching methods may be used. For example, laser ablation, etc. can be used. As shown in FIG. 4E, the etching exposes the underlying insulating layer 43 and source and drain electrodes 44a and 44b in the region of the opening. Next, a hydrophilic layer 47 is formed in the opening 46a of the hydrophobic layer 46 as shown in FIG. 4F. In particular, the hydrophilic layer 47 is formed on the portions of the insulating layer 37 and source and drain electrodes 44a and 44b that were exposed by the etching. The hydrophilic layer 47 may be formed using a known method such as, a deposition method; a coating method, such as, for example, spin coating, dip coating, micro contact printing, inkjet printing, etc.; or a self-assembled monolayer manufacturing method, all of which are known to those of skill in the art.

Figure 4G:
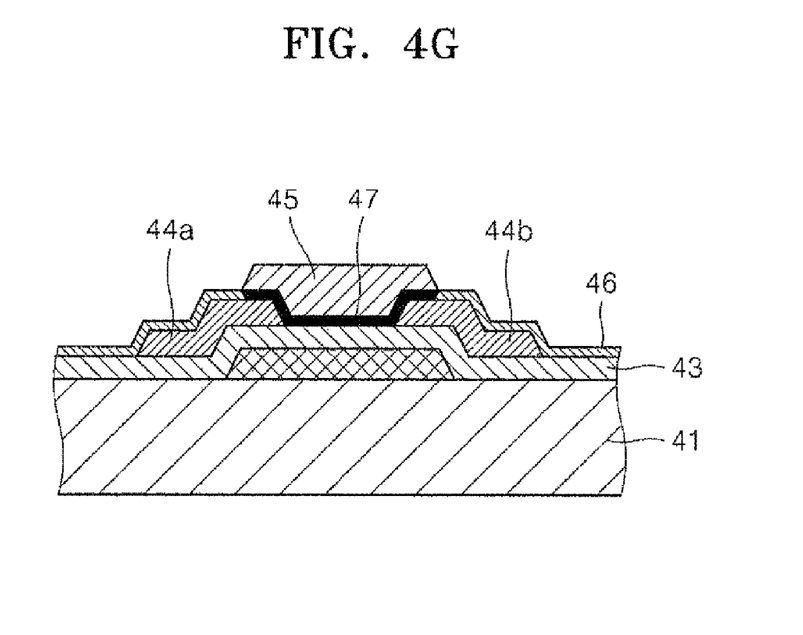

Next, the organic semiconductor layer 45 is formed on the hydrophilic layer 47 as shown in FIG. 4G by providing an organic semiconductor layer forming material. Since the organic semiconductor forming material is typically a hydrophilic material, the organic semiconductor forming material is attracted to the hydrophilic layer 47 and repelled by the hydrophobic layer 46. Thereby, the organic semiconductor layer can be formed only on the hydrophilic layer 47 even when both the hydrophobic layer 46 and the hydrophobic layer 47 come into contact with the material that forms the organic semiconductor layer 45. Therefore, an additional patterning process is unnecessary to form the organic semiconductor layer 45 in the desired location.

The method described herein provides a TFT having the same structure as the TFT shown in FIG. 1. Although different reference numerals are used, it is to be understood that the substrate 41, gate electrode 42, insulating layer 43, hydrophobic layer 46, hydrophilic layer 47, organic semiconductor layer 45 and source and drain electrodes 44a and 44b described in the method have the same composition as the equivalent structures in the TFT 10 of FIG. 1 as described above.

As would be apparent to persons skilled in the art, the TFTs 10' and 10" shown in FIGS. 2 and 3 can be manufactured by changing the order in which the various layers are deposited.

A TFT having the above-mentioned structure may be included in a flat panel display, such as a liquid crystalline display (LCD), an organic light-emitting display, etc.

Figure 5:
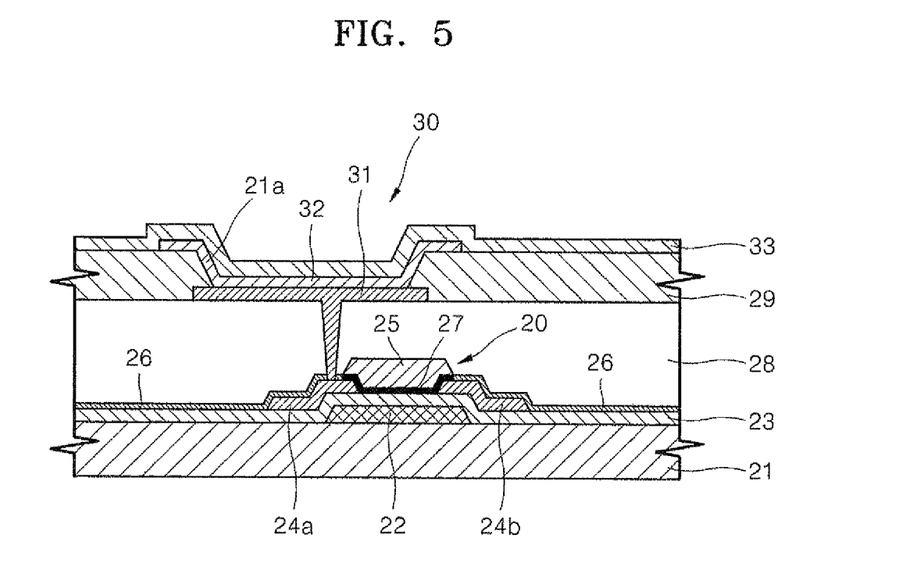
FIGS. 5 and 6 are sectional views illustrating an organic light emitting display device having a TFT according to an embodiment of the present invention.

FIG. 5 is a sectional view of an organic light-emitting display according to an embodiment of the present invention as a flat panel display including a TFT 20 according to an aspect of the present invention.

FIG. 5 illustrates a single sub-pixel of an organic light-emitting display. Typically, each sub-pixel of an organic light-emitting display includes an organic light-emitting device (OLED) 30 as a self-luminous element and at least one TFT.

The organic light-emitting display may include various pixel patterns, such as, for example, red, green, and blue pixels, according to a luminescent color of the organic light-emitting device.

Referring to FIG. 5, a gate electrode 22 having a predetermined pattern is formed on a substrate 21, and an insulating layer 23 is formed to cover the gate electrode 22. Source and drain electrodes 24a and 24b are formed on the insulating layer 23. A hydrophobic layer 26 and a hydrophilic layer 27 are formed on the source and drain electrodes 24a and 24b. An organic semiconductor layer 25 is formed on the hydrophilic layer 27. Each layer included in the TFT 20 is equivalent to the corresponding layers in the TFT of FIG. 1, and thus a detailed description of each layer will be omitted.

After the organic semiconductor layer 25 is formed, a passivation layer 28 is formed to cover the TFT 20. The passivation layer 28 is formed as a single-layered or multi-layered structure, and may be formed of an organic material, an inorganic material or an organic/inorganic composite material.

A pixel defining layer 29, which defines a pixel, is formed on the passivation layer 28. A pixel electrode 31 is formed on the pixel defining layer 29 and a portion of the pixel electrode extends through the pixel defining layer 29 to connect with one of the source and drain electrodes 24a and 24b. An organic layer 32 of the OLED 30 is formed on a pixel electrode 31.

An organic light emitting display device made up of a plurality of organic light emitting devices 30 displays predetermined image information by emitting light of red, green and blue color according to the flow of current. The organic light emitting device 30 includes the pixel electrode 31 connected to one of the source and drain electrodes 24a and 24b, a facing electrode 33 covering the entire pixel, and the organic layer 32 interposed between the pixel electrode 31 and the facing electrode 33. The present invention is not limited to this structure, and the OLED 30 can have various structures.

The organic layer 32 may be a small-molecular weight organic layer or a polymer organic layer. When the organic layer 32 is a small-molecular weight organic layer, the organic layer 32 may have a structure including one of a hole injection layer (HIL), a hole transport layer (HTL), an emission layer (EML), an electron transport layer (ETL), and an electron injection layer (EIL) or combinations of these layers. Examples of organic materials for the small-molecular weight organic layer include copper phthalocyanine (CuPc), N,N-di(naphthalene-1-yl)-N,N'-diphenyl-benzidine (NPB), tris-8-hydroxyquinoline aluminum (Alq3), etc. The small-molecular weight organic layer can be formed using a deposition method such as, for example, vacuum deposition.

When the organic layer 32 is a polymer organic layer, the organic layer 32 may have a structure including an HTL and an EML. The HTL may be formed of poly-3,4-ethylenedioxythiophene (PEDOT), and the EML may be formed of a poly-phenylenevinylene (PPV)-based or polyfluorene-based polymer material using screen printing, inkjet printing, etc.

The organic layer 32 is not limited to the above-described organic layers, and may have various structures.

The pixel electrode 31 may act as an anode, and the facing electrode 33 may act as a cathode. Alternatively, the polarities of the pixel electrode 31 and the facing electrode 33 may be reversed. That is, the pixel electrode 31 may act as a cathode, and the facing electrode 33 may act as an anode.

Figure 6:
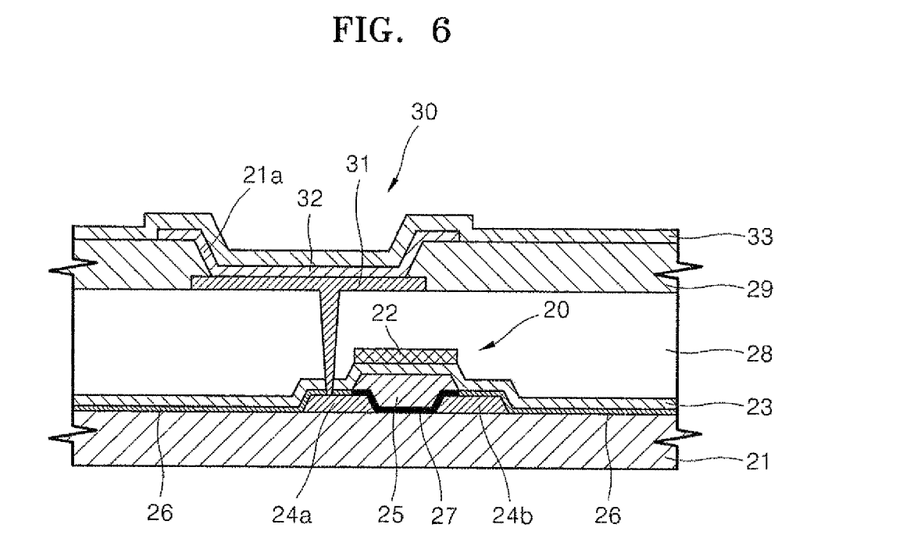

FIG. 6 is a sectional view illustrating a flat panel display according to another embodiment of the present invention. The flat panel display of FIG. 6 is the same as the flat panel display of FIG. 5 except that the TFT as shown in FIG. 3 is used.

A TFT according to an aspect of the present invention may also be used in a liquid crystal display (LCD). Unlike a method of manufacturing an organic light-emitting display, a method of manufacturing an LCD further includes forming a lower substrate by forming a lower alignment layer (not shown) covering the pixel electrode 31.

A TFT according to aspects of the present invention can be installed in each sub-pixel as illustrated in FIG. 5, or in a driver circuit (not shown) where no image is formed.

The present embodiments will be described in further detail with reference to the following example.

EXAMPLE

A substrate including a gate electrode formed of MoW (100-nm thick), an insulating layer formed of $SiO_2$ (200-nm thick), and source and drain electrodes formed of ITO (100-nm thick) was prepared. The substrate was soaked in an octadecyl trichlorosilane solution (50 mM anhydrous toluene) for three hours. The substrate was washed with toluene, acetone, and then isopropanol, and dried at 120° for an hour and cured to form a hydrophobic layer to cover the source and drain electrodes and the insulating layer. The hydrophobic layer included a unit having formula (3).

Next, a region corresponding to the organic semiconductor layer, was exposed by etching the hydrophobic layer using a KrF excimer laser as a laser ablation apparatus. In the etching, hydroxyl groups present on the surface of the insulating layer and source and drain electrodes were exposed and then were allowed to react with a hydrophilic layer forming material when coming into contact with the same, thereby forming a hydrophilic layer in the region etched from the hydrophobic layer.

The resulting substrate was soaked in a phenyl trichlorosilane solution (50 mM anhydride toluene), as a hydrophilic layer forming material, for three hours. The substrate was washed sequentially with toluene, acetone and isopropanol, and dried and cured at 120° for an hour. The hydrophilic layer including a unit having formula (7) was formed in the region defined by the opening of the hydrophobic layer.

Next, pentacene was deposited onto the substrate was such that the organic semiconductor layer (70 nm) was formed only on the hydrophilic layer, thereby resulting in an organic TFT being according to an aspect of the present invention.

As described above, in a TFT according to aspects of the present invention, because the hydrophobic layer and the hydrophilic layer are formed before forming the organic semiconductor layer, the organic semiconductor layer can be subsequently formed only on the hydrophilic layer without an additional etching process. Therefore, the manufacturing cost and time of the TFT can be decreased, and the electric properties of the TFT can be improved. Thus, a flat panel display with improved reliability can be realized using the TFT.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor comprising:
    a gate electrode;
    source and drain electrodes insulated from the gate electrode;
    an organic semiconductor layer that is insulated from the gate electrode and electrically connected to the source and drain electrodes;
    an insulating layer that insulates the gate electrode from the source and drain electrodes or the organic semiconductor layer;
    a hydrophobic layer which covers the source and drain electrodes and/or the insulating layer and has an opening that defines a region corresponding to the organic semiconductor layer; and
    a hydrophilic layer formed in the region defined by the opening of the hydrophobic layer, and
        wherein the organic semiconductor layer is formed on the hydrophilic layer.

2. The thin film transistor of claim 1, wherein:
    the gate electrode is formed on the substrate;
    the insulating layer covers the gate electrode;
    the source and drain electrodes are formed on the insulating layer;
    the hydrophobic layer contacts the source and drain electrodes;
    the region defined by the opening in the hydrophobic layer and in which the hydrophilic layer is formed contacts the source and drain electrodes and contacts the insulating layer between the source and drain electrodes.

3. The thin film transistor of claim 1, wherein:

the gate electrode is formed on the substrate;

the insulating layer covers the gate electrode and the substrate;

the hydrophobic layer contacts the insulating layer;

the region defined by the opening in the hydrophobic layer and in which the hydrophilic layer is formed contacts the insulating layer in a region where the insulating layer covers the gate electrode; and the source and drain electrodes contact the hydrophobic layer and the organic semiconductor layer.

4. The thin film transistor of claim 1, wherein:

the source and drain electrodes are formed on the substrate;

the hydrophobic layer contacts the substrate and the source and gate electrodes;

the region defined by the opening in the hydrophobic layer and in which the hydrophilic layer is formed contacts the source and drain electrodes and contacts the substrate between the source and drain electrodes;

the insulating layer covers the hydrophobic layer and the organic semiconductor layer; and the gate electrode is formed on the insulating layer in a region where the insulating layer contacts the organic semiconductor layer.

5. The thin film transistor of claim 1, wherein the hydrophobic layer has a contact angle of water that is greater than a contact angle of water of the hydrophilic layer.

6. The thin film transistor of claim 1, wherein the hydrophobic layer includes a group that allows a contact angle of water on the hydrophobic layer to be at least 90°.

7. The thin film transistor of claim 1, wherein the hydrophilic layer includes a group that allows a contact angle of water on the hydrophilic layer to be 10°-90°.

8. The thin film transistor of claim 1, wherein the organic semiconductor layer includes at least one of pentacene, tetracene, anthracene, naphthalene, α-6-thiophene, α-4-thiophene, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylenevinylene and a derivative thereof, polyparaphenylene and a derivative thereof, polyfluorene and a derivative thereof, polythiophenevinylene and a derivative thereof, polythiophene-hetero aromatic copolymer and a derivative thereof, an oligonaphthalene and a derivative thereof, an oligothiophene of α-5-thiophene and a derivative thereof, metal-containing or metal-free phthalocyanine and a derivative thereof, pyromellitic dianhydride and a derivative thereof, and pyromellitic diimide and a derivative thereof.

9. The thin film transistor of claim 1, wherein the source and drain electrodes include at least one group selected from the group consisting of Au, Pd, Pt, Ni, Rh, Ru, Ir, Os, Al, Mo, an Al:Nd alloy, an MoW alloy, ITO, IZO, NiO, $Ag_2O$, $In_2O_3$—$Ag_2O$, $CuAlO_2$, $SrCu_2O_2$, and Zr-doped ZnO.

10. The thin film transistor of claim 1, wherein the hydrophobic layer includes a $C_3$-$C_{30}$ alkyl group or a $C_3$-$C_{30}$ alkyl group substituted by at least one halogen atom.

11. The thin film transistor of claim 10, wherein the hydrophobic layer includes a unit having formula (1) below and a repeating unit having formula (2) below:

formula (1)

formula (2)

where $R_1$, $R_2$ and $R_3$ are each selected from a halogen atom; a $C_3$-$C_{30}$ alkyl group; and a $C_3$-$C_{30}$ alkyl group substituted by at least one halogen atom, wherein at least one of $R_1$, $R_2$ and $R_3$ is a $C_3$-$C_{30}$ alkyl group, or $C_3$-$C_{30}$ alkyl group substituted by at least one halogen atom;

$R_4$ is a $C_3$-$C_{30}$ alkyl group, or a $C_3$-$C_{30}$ alkyl group substituted by at least one halogen atom; and

* indicates binding with the source and drain electrodes or the insulating layer.

12. The thin film transistor of claim 10, wherein the hydrophobic layer includes a unit having formula (3) or (4) below:

formula (3)

formula (4)

where * indicates binding with the source and drain electrodes or the insulating layer.

13. The thin film transistor of claim 1, wherein the hydrophilic layer includes a $C_5$-$C_{30}$ aryl group, a $C_3$-$C_{30}$ heteroaryl group, a $C_6$-$C_{30}$ aralkyl group or a $C_4$-$C_{30}$ heteroaralkyl group.

14. The thin film transistor of claim 13, wherein the hydrophilic layer includes a unit having formula (5) below and a repeating unit having formula (6) below:

formula (5)

formula (6)

where $Q_1$, $Q_2$ and $Q_3$ are each selected from a halogen atom, a $C_5$-$C_{30}$ aryl group, a $C_3$-$C_{30}$ heteroaryl group, a $C_6$-$C_{30}$ aralkyl group or a $C_4$-$C_{30}$ heteroaralkyl group, wherein at least one of $Q_1$, $Q_2$ and $Q_3$ are a $C_5$-$C_{30}$ aryl group, a $C_3$-$C_{30}$ heteroaryl group, a $C_6$-$C_{30}$ aralkyl group or a $C_4$-$C_{30}$ heteroaralkyl group;

$Q_4$ is a $C_5$-$C_{30}$ aryl group, a $C_3$-$C_{30}$ heteroaryl group, a $C_6$-$C_{30}$ aralkyl group or a $C_4$-$C_{30}$ heteroaralkyl group;

*' indicates binding with the source and drain electrodes or the insulating layer.

15. The thin film transistor of claim 13, wherein the hydrophilic layer includes a unit having formula (7) or (8) below:

formula (7)

formula (8)

where *' indicates binding with the source and drain electrodes or the insulating layer.

16. A pixel of a light-emitting display device comprising at least one thin film transistor of claim 1 and at least one light-emitting device electrically connected to the at least one thin film transistor.

17. The pixel of claim 16, wherein the light-emitting device is an organic light-emitting device.

18. A flat panel display device comprising a plurality of pixels according to claim 16.

* * * * *